United States Patent [19]
Freeman

[11] Patent Number: 4,870,302
[45] Date of Patent: Sep. 26, 1989

[54] CONFIGURABLE ELECTRICAL CIRCUIT HAVING CONFIGURABLE LOGIC ELEMENTS AND CONFIGURABLE INTERCONNECTS

[75] Inventor: Ross H. Freeman, San Jose, Calif.

[73] Assignee: Xilinx, Inc., San Jose, Calif.

[21] Appl. No.: 158,011

[22] Filed: Feb. 19, 1988

Related U.S. Application Data

[63] Continuation of Ser. No. 588,478, Mar. 12, 1984, abandoned.

[51] Int. Cl.[4] .............. H04Q 1/00; H03K 17/693; H03K 19/096; H03K 3/01
[52] U.S. Cl. .................. 307/465; 307/468; 307/469; 364/716; 364/784; 340/825.84; 340/825.86; 340/825.87; 340/825.91
[58] Field of Search ............... 307/465, 466, 467, 468, 307/469, 471; 364/716, 784; 340/825.83–825.91

[56] References Cited

U.S. PATENT DOCUMENTS

| | | | |
|---|---|---|---|
| 3,201,574 | 8/1965 | Szekely | 235/175 |
| 3,400,379 | 9/1968 | Harman | 235/156 |
| 3,431,433 | 3/1969 | Ball et al. | 307/279 |
| 3,439,185 | 4/1969 | Gibson | 307/448 |
| 3,483,400 | 12/1969 | Washizuka et al. | 307/279 |
| 3,564,514 | 2/1971 | Gunderson | 340/172.5 |
| 3,576,984 | 5/1971 | Gregg, Jr. | 235/176 |
| 3,619,583 | 11/1971 | Arnold | 307/465 |
| 3,667,054 | 5/1972 | Nelson | 307/234 |
| 3,691,401 | 9/1972 | Forlani et al. | 307/448 |
| 3,743,948 | 7/1973 | Dahlin et al. | 328/119 |
| 3,750,115 | 7/1973 | Mundy | 340/172.5 |
| 3,818,252 | 6/1984 | Chiba et al. | 307/465 |
| 3,838,296 | 9/1974 | McLeod | 307/243 |
| 3,849,638 | 11/1974 | Greer | 235/152 |
| 3,967,251 | 6/1976 | Levine | 365/94 |
| 3,983,543 | 9/1976 | Cordaro | 307/238 |
| 3,990,045 | 11/1976 | Beausoleil et al. | 307/465 |
| 4,032,894 | 6/1977 | Williams | 340/825.83 |
| 4,091,359 | 5/1978 | Rossler | 340/166 R |
| 4,154,978 | 5/1979 | Tu | 307/242 |

(List continued on next page.)

FOREIGN PATENT DOCUMENTS

| | | |
|---|---|---|
| 0094234 | 11/1983 | European Pat. Off. . |
| 0031431 | 3/1984 | European Pat. Off. . |
| 3202498A1 | 8/1983 | Fed. Rep. of Germany . |
| 2160969 | 7/1973 | France . |
| 137616 | 1/1978 | Japan . |
| 141836 | 11/1980 | Japan . |
| 191535 | 11/1983 | Japan . |
| 1090520 | 11/1967 | United Kingdom . |
| 1101851 | 1/1968 | United Kingdom . |
| 1516817 | 7/1978 | United Kingdom . |
| 2045488B | 10/1982 | United Kingdom . |
| 2121573B | 12/1984 | United Kingdom . |
| A2171231 | 8/1986 | United Kingdom . |
| 1059213 | 2/1987 | United Kingdom . |
| 2138188B | 7/1987 | United Kingdom . |

OTHER PUBLICATIONS

"Ungated Common I/O Buffer for Card Testing," by
(List continued on next page.)

Primary Examiner—Stanley D. Miller
Assistant Examiner—David R. Bertelson
Attorney, Agent, or Firm—Skjerven, Morrill, MacPherson, Franklin & Friel

[57] ABSTRACT

A configurable logic array comprises a plurality of configurable logic elements variably interconnected in response to control signals to perform a selected logic function. Each configurable logic element in the array is in itself capable of performing any one of a plurality of logic functions depending upon the control information placed in the configurable logic element. Each configurable logic element can have its function varied even after it is installed in a system by changing the control information placed in that element. Structure is provided for storing control information and providing access to the stored control information to allow each configurable logic element to be properly configured prior to the initiation of operation of the system of which the array is a part. Novel interconnection structures are provided to facilitate the configuring of each logic element.

29 Claims, 15 Drawing Sheets

U.S. PATENT DOCUMENTS

| | | | |
|---|---|---|---|
| 4,157,589 | 6/1979 | Kapral et al. | 364/716 |
| 4,244,032 | 1/1981 | Oliver | 364/900 |
| 4,281,398 | 7/1981 | McKenny et al. | 307/441 |
| 4,284,953 | 8/1981 | Hepworth et al. | 328/37 |
| 4,307,379 | 12/1981 | Wyland et al. | 340/825.83 |
| 4,366,393 | 12/1982 | Kasuya | 307/465 X |
| 4,390,970 | 6/1983 | Kay | 307/481 |
| 4,409,680 | 10/1983 | Schnathorst et al. | 377/67 |
| 4,415,973 | 11/1983 | Evans | 364/200 |
| 4,446,382 | 5/1984 | Moore et al. | 307/241 |
| 4,453,096 | 6/1984 | LeCan et al. | 307/468 |
| 4,458,163 | 7/1984 | Wheeler et al. | 307/466 |
| 4,495,629 | 1/1985 | Zasio et al. | 377/70 |
| 4,508,977 | 4/1985 | Page et al. | 307/468 |
| 4,541,067 | 9/1985 | Whitaker | 307/471 X |
| 4,541,114 | 9/1985 | Rutenbar et al. | 364/491 |
| 4,551,814 | 11/1985 | Moore et al. | 307/465 |
| 4,551,815 | 11/1985 | Moore et al. | 307/465 X |
| 4,558,236 | 12/1985 | Burrows | 307/465 |
| 4,564,773 | 1/1986 | Tanizawa et al. | 307/465 |
| 4,600,846 | 7/1986 | Burrows | 307/465 |
| 4,622,648 | 11/1986 | Whitaker | 364/784 X |
| 4,642,487 | 2/1987 | Carter | 307/465 |
| 4,670,749 | 6/1987 | Freeman | 307/465 X |
| 4,700,187 | 10/1987 | Furtek | 307/465 X |
| 4,706,217 | 11/1987 | Shimizu et al. | 307/465 X |
| 4,717,912 | 1/1988 | Harvey et al. | 307/465 X |
| 4,727,268 | 2/1988 | Hori | 307/465 |
| 4,742,252 | 5/1988 | Agrawal | 307/465 |
| 4,742,383 | 5/1988 | Fitzgerald | 307/465 X |
| 4,758,745 | 7/1988 | Elgamal et al. | 307/465 |
| 4,774,421 | 9/1988 | Hartmann et al. | 307/465 |

OTHER PUBLICATIONS

R. D. Harrod and H. R. Moore, IBM T.D.B., vol. 21, No. 6 11/78.

"Introduction to VSLI–Systems," C. Mead and L. Conway, Oct. 1980, pp. 150–158, Addison–Wesley Publ., Reading, U.S.

"Programmable Cellular Arrays," B. S. Raju et al., International Journal of Control, vol. 14, No. 6, Dec. 1971, pp. 1041–1051; London, G.B.

"Non–Arithmetical Cellular Arrays," K. J. Dean et al., Proceedings of the Institution of Electrical Engineers, vol. 119, No. 7, Jul. 1972, pp. 785–789.

"Thin Film Universal Logic Block," Gamblin et al., IBM T.D.B., vol. 9, No. 6, Nov. 1966, pp. 662–664.

"General Function Circuit," Machart et al., IBM T.D.B., vol. 15, No. 1, Jun. 1972, p. 11.

─|─ = (i.e., Crossover without Connection or Possibility of Connection)

─+─ or ─♦─ (i.e., Can Only be Connected or Disconnected, As Input or Output, But Cannot be Broken)

─╫─ = Full Interchange - e.g. Figure 7B-7

─✱─ = Full Interchange - e.g. Figure 7B-3

─✦─ = Partial Interchange: ─┴─ ─┴─ ─┴─ ─┴─ ─┴─

Lines (4 Vertical Shown) that do not have ─╫─ or ─✱─ Intersections are Intended to be Low Skew (i.e., Clock or Other) Paths.

─▣─ =Bidirectional Amplifier (Direction is Selectable) to Prevent Signal Drooping Through too Many Pass Devices. (Figure 10B)

*Figure 4B*

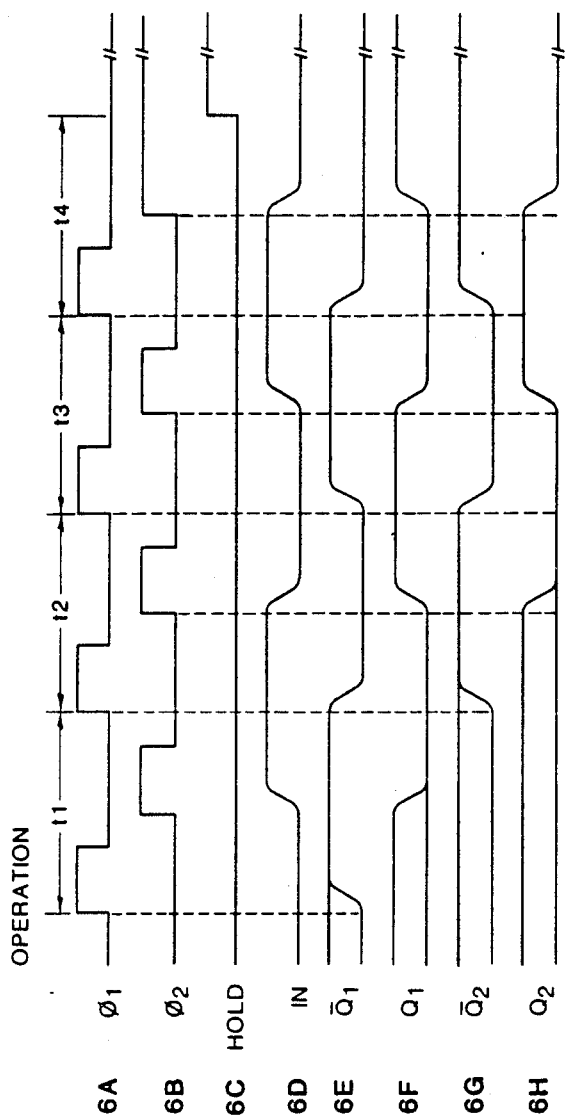

Timing Diagram Shows 01010 being Shifted into the Shift Register. When $\varnothing_1$ is Low, $\varnothing_2$ and HOLD may be Brought High, thus Holding the Data Indefinitely. The Entire Shift Register may be Set or Cleared by Setting or Clearing the Input with $\varnothing_1$ and $\varnothing_2$ High and Hold Low. Enough Set/Reset Time must be Allowed for the Signal to Propagate the Entire Length of the Shift Register.

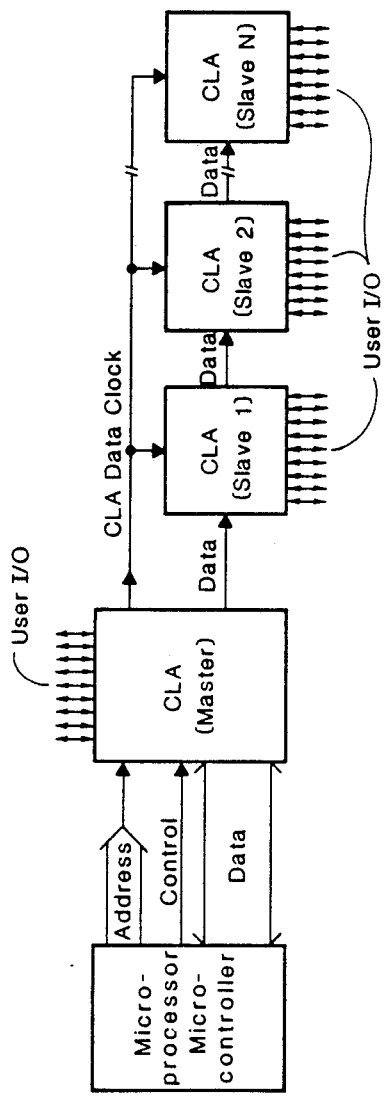
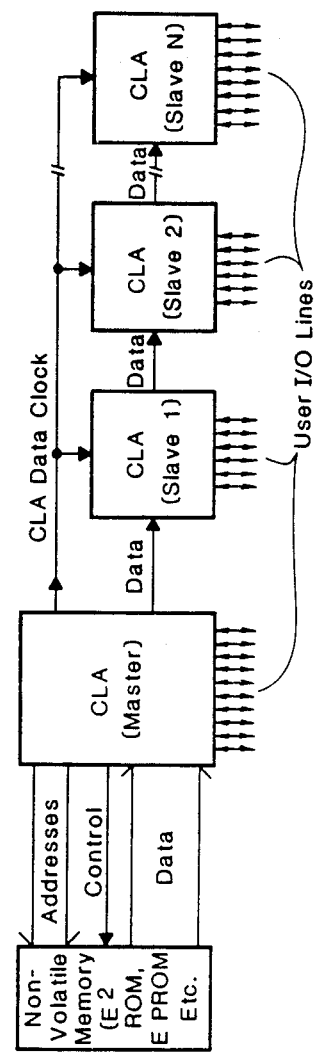
Figure 8A
Figure 8B

Circled numbers on ends of pass devices
indicate which paths are directly connected.

Examples of possible connections with this method:

BIDIRECTIONAL SELECTABLE BUFFER

CONFIGURABLE ELECTRICAL CIRCUIT HAVING CONFIGURABLE LOGIC ELEMENTS AND CONFIGURABLE INTERCONNECTS

This application is a continuation of application Ser. No. 06/588,478, filed 03/12/84.

BACKGROUND OF THE INVENTION

1. Field of the Invention

This invention relates to configurable electrical circuits and in particular, to a method means for providing on-chip programming of each of a plurality of logic elements formed on a chip of semiconductor material to configure each logic element to carry out certain desired functions, and to configure interconnects between the logic elements.

2. Prior Art

Gate arrays are well known in the prior art. Typically a gate array is produced by interconnecting a plurality of active devices in a base array in any one of a number of ways to achieve a desired logic function. As gate arrays become more complex, the simulation of the logic to be achieved from a given interconnection of the active devices in the base array becomes more difficult and is typically carried out using a computer program. The layout of the actual interconnections for the active devices in the base array to yield a finished gate array is then derived using a computer aided design program of a type well known in the art. The process of designing such a structure is complex and reasonably expensive requiring the use of logic simulation and verification programs and semiconductor device layout programs. Accordingly, a need exists for an alternative approach which significantly simplifies the obtaining of a given logic function from a base array.

SUMMARY

In accordance with this invention, I provide a structure which I denote as a configurable logic array which allows changing the configuration of the finished integrated circuit from time-to-time (even when the integrated circuit is installed in a system) to provide any one of a plurality of logical functions from the same integrated circuit. In accordance with my invention, by providing a number of "configurable logical elements" (also referred to herein as "logic elements") in the base array, a new type of integrated circuit is achieved which is capable of being configured to provide any one of a plurality of logic functions depending upon the tasks which the system of which it is a part is called upon to perform. By "configurable logical element" I mean a combination of devices which are capable of being electrically interconnected by switches operated in response to control bits to perform any one of a plurality of logical functions.

A configurable logic array of my invention is comprised of a multiplicity of configurable logic elements each of which can include all the circuit elements necessary to provide one or more of the functions provided by an AND gate, flip flop, inverter, NOR gate, exclusive OR gate, and combinations of these functions to form more complex functions. In accordance with my invention, the particular function to be carried out by a configurable logic element is determined by control signals applied to the configurable logic element from control logic. Depending on the control signals, the configurable logic element of one embodiment of my invention can function as an AND gate, an OR gate, a NOR gate, a NAND gate or an exclusive OR gate or any one of a number of other logic elements without any change in physical structure. In accordance with my invention, structure is provided to allow any one of a plurality of functions to be performed by each configurable logic element. Selecting a desired function is done by providing control logic to store and generate control signals which control the configuration of each configurable logic element.

In one embodiment of my invention, the control signals are stored and transmitted by control logic formed integrally with and as part of the integrated circuit chip containing the configurable logic element. However, if desired the control information can be stored and/or generated outside this integrated circuit and transmitted through pins to the configurable logic element.

In general, in accordance with my invention, a given set of control signals is transmitted to one configurable logic element to control the configuration of that configurable logic element. The control logic is thus arranged to provide any one set of a plurality of sets of control bits to each configurable logic element on the chip. The actual set of control bits provided to each configurable logic element on the integrated circuit chip depends on the function to be carried out by the integrated circuit chip or by each configurable logic element on the chip. The configuration of each logic element on the chip is determined by the intended function of the total chip and by the intended function of that configurable logic element as part of the chip. Thus the resulting structure is known as a "Configurable Logic Array" of "CLA" and each logic element in the array is known as a "Configurable Logic Element" or "CLE".

In general, each integrated circuit chip has in addition to and associated with the control logic certain on-chip data routing circuitry including configurable interconnects. In one embodiment the on-chip data routing is achieved by using a memory to store the particular data used to configure the configurable logic elements and by then transferring the data from the memory to a novel combination of a dynamic shift register and static latch element within or associated with each configurable logic element on the chip.

The particular structure of this invention is versatile in that it can be implemented particularly easily using P channel, N channel, or CMOS technologies in the embodiment shown. Of course, structure incorporating the principles of this invention can, if desired, be implemented using any other appropriate semiconductor technology. The novel dynamic shift register-static latch element of this invention is particularly useful in that the structural "overhead" (i.e., access circuitry and routing circuitry) is kept to a minimum relative to the useful logic functions on the total chip. Of particular importance, no addressing, data selection, or decoding in each configurable logic element is necessary when this novel combination of a dynamic shift register and static latch element is used to implement the configurable logic array of my invention.

This invention will be more fully understood in conjunction with the following detailed description taken together with the drawings.

DESCRIPTION OF THE DRAWINGS

FIG. 4B shows the key to the cross-connections between crossing conductive leads in FIG. 4B;

FIGS. 6A through 6H represent wave forms of use in explaining the operation of the novel structure of FIG. 5;

FIGS. 7B-1 through 7B-7 are the key showing the types of interconnections made by the symbols shown in FIG. 7A;

FIG. 8A illustrates a system with a microprocessor controller and four configurable logic arrays;

FIG. 8B illustrates a combination of four configurable logic arrays together with a nonvolatile memory;

DETAILED DESCRIPTION

The following detailed description of this invention is meant to be illustrative only and not limiting. Other embodiments of this invention will be obvious to those skilled in the art in view of the following disclosure.

Figure 1:
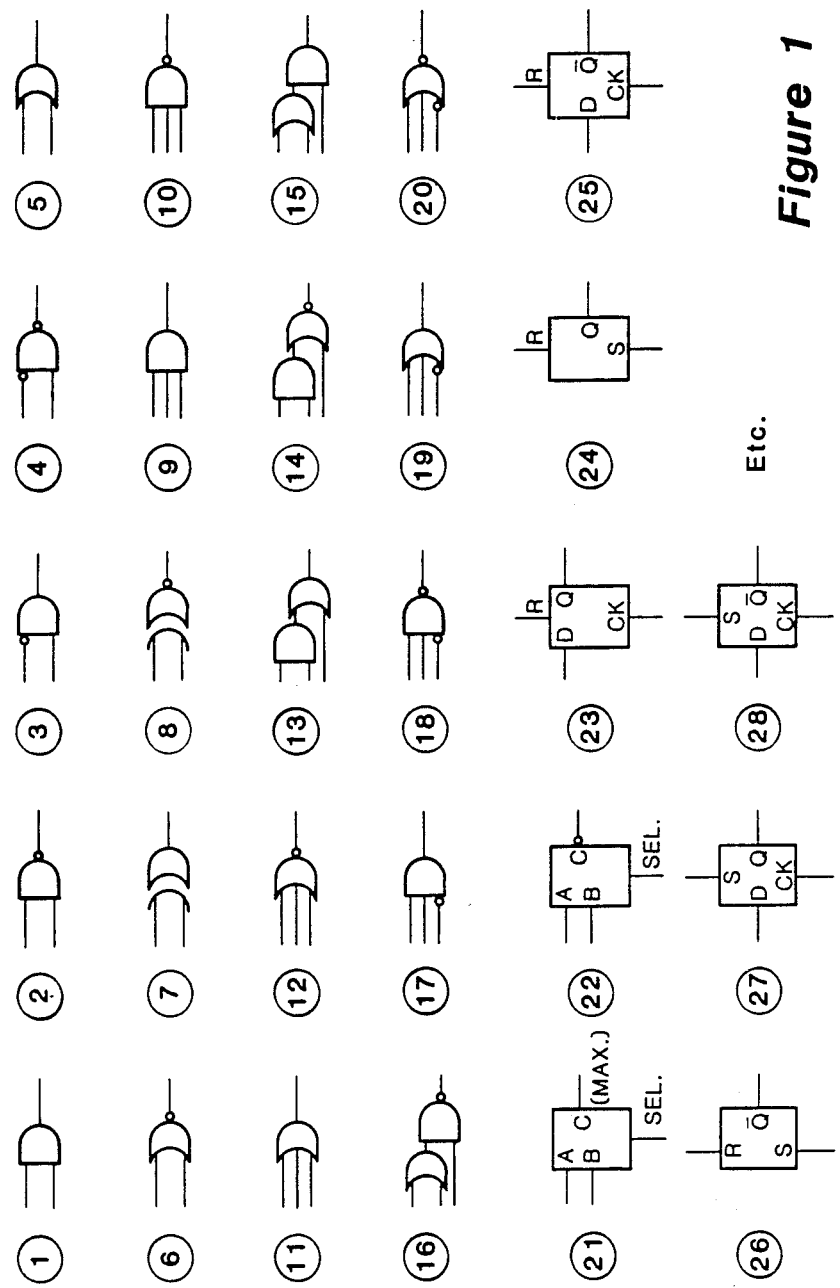
FIG. 1 illustrates some of the various logic functions capable of being provided by each logic element in a configurable logic array.

Turning now to FIG. 1, FIG. 1 illustrates certain logic functions capable of being integrated into a configurable logic element. The 28 functions shown in FIG. 1 are merely illustrative and other elements not shown can, if desired, be included in a configurable logic element. The following elements are shown:

| Element | Function |
|---------|----------|
| 1 | AND gate |
| 2 | NAND gate |
| 3 | AND gate with inverted input |
| 4 | NAND gate with inverted input |
| 5 | OR gate |
| 6 | NOR gate |
| 7 | exclusive OR gate |
| 8 | exclusive NOR gate |
| 9 | 3 input AND gate |
| 10 | 3 input NAND gate |
| 11 | 3 input OR gate |
| 12 | 3 input NOR gate |
| 13 | OR gate with one input comprising AND gate |
| 14 | NOR gate with one input comprising AND gate |
| 15 | AND gate with one input comprising OR gate |
| 16 | NAND gate with one input comprising OR gate |
| 17 | 3 input AND gate with one input inverted |
| 18 | 3 input NAND gate with one inverted input |
| 19 | 3 input OR gate with one inverted input |
| 20 | 3 lead NOR gate with one inverted input |
| 21 | one of two inputs multiplexer |
| 22 | inverting one of two inputs multiplexer |
| 23 | "D" flip flop with reset |
| 24 | Set-Reset latch |
| 25 | "D" flip-flop with reset and inverted output |
| 26 | Set-reset latch with reset and inverted output |
| 27 | "D" flip-flop with set |
| 28 | "D" flip-flop with set and inverted output |

Of course, other logic elements can also be implemented in accordance with this invention.

Figure 2:
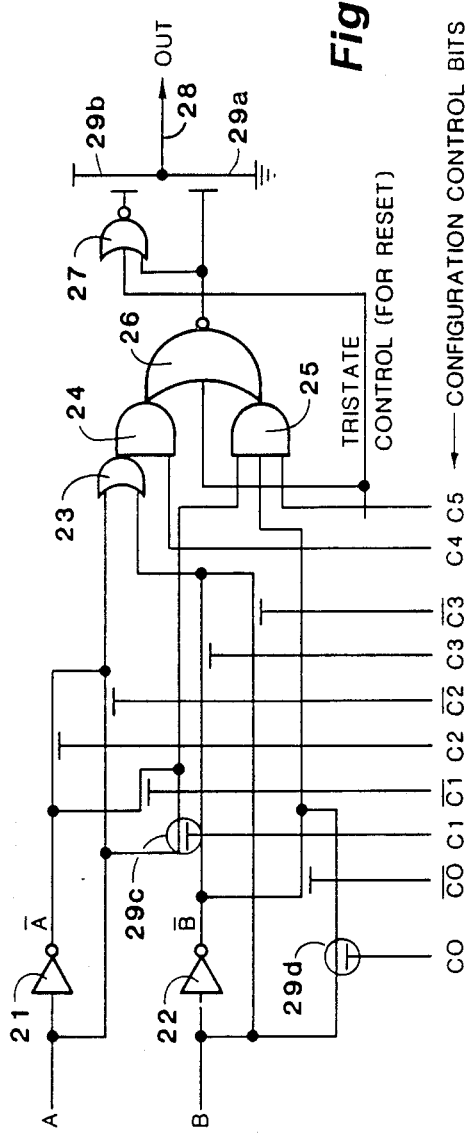
FIG. 2 illustrates the internal logic structure of one possible logic element capable of implementing a number of useful functions with two variables A, B and certain configuration control bits, C0 through C5.

FIG. 2 illustrates the internal logic structure of one possible logic element which is capable of implementing all useful functions of the two variables A and B, with the functions being selected by configuration control signals C0, $\overline{C0}$, C1, $\overline{C1}$... through C5, as shown in FIG. 2. For example, to implement an AND gate function using the structure shown in FIG. 2, the input leads labeled A and B are shunted past inverters 21 and 22, respectively, by high level signals on the C1 and C0 configuration control leads. Leads C1 and C0 are connected to well-known pass transistors 29c and 29d. (Throughout this specification a pass transistor will be represented by the symbol shown within the circles 29c and 29d). Low level signals are applied to the configuration control leads $\overline{C0}$, $\overline{C1}$, C4. Assuming that C0, C1 and all of the other leads are connected to N channel MOS pass transistors, the control signals, C2, $\overline{C2}$; C3 and $\overline{C3}$ are "don's cares". That is, these signals can be high or low without affecting the output signal. In addition, a high level signal on C5 is applied to enable AND gate 25. Thus AND gate 25 serves as a two input AND gate providing to NOR gate 26 the logical AND of input variables A and B. The signal from AND gate 25 is passed through NOR gate 26. NOR gate 26 converts the high level signal from gate 25 to a low level signal to turn off MOS transistor 29a (the source of which is grounded and the drain of which is connected to the output lead 28) and to turn on through NOR gate 27 N channel transistor 29b (the drain of which is connected to a power supply and the source of which is connected to both the output lead 28 and the drain of N channel transistor 29a). Thus the structure of FIG. 2 configured as described above is an AND gate. Other logic functions can also be produced by appropriate selection of the control signals to be supplied to the configuration control leads C0 through C5 to activate the appropriate pass transistors and gates within the structure.

Figure 3B:
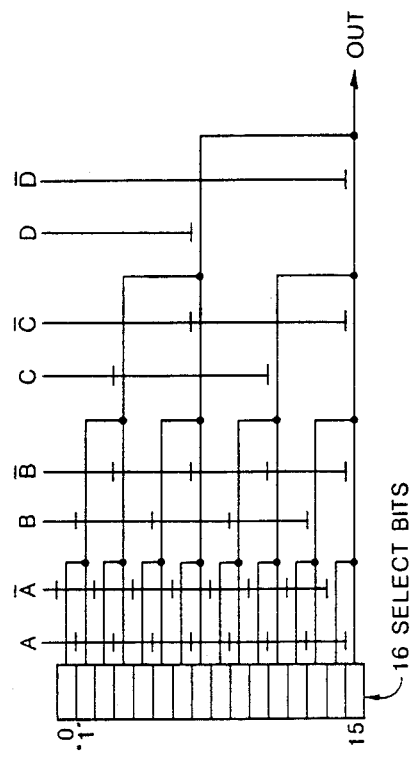
FIG. 3B illustrates a selection structure for selecting any one of sixteen bits capable of implementing $2^{16}$ functions, for transmittal to an output lead.
Figure 3A:
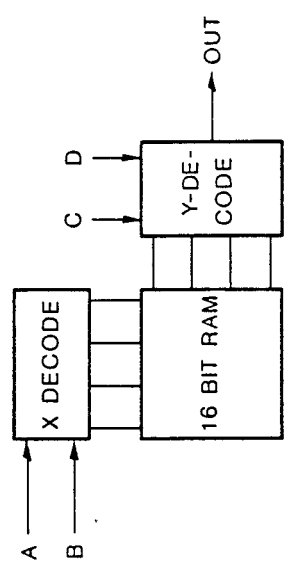
FIG. 3A illustrates a 16 bit RAM select circuit wherein any one of sixteen possible input states is capable of being identified and $2^{16}$ functions are capable of being implemented.
Figures 3C, 3D:
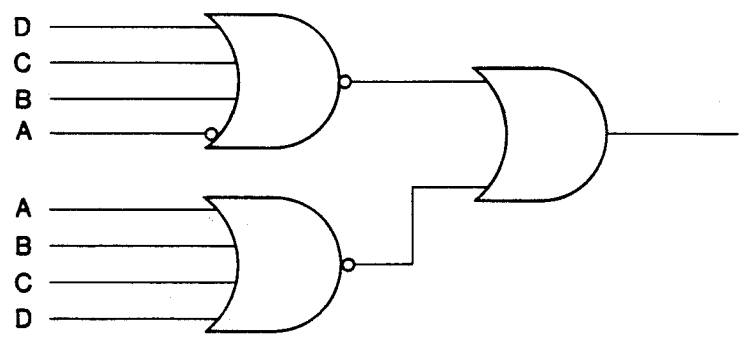
FIG. 3C illustrates one possible Karnaugh plot for the structure of FIG. 3A.
FIG. 3D illustrates the logic gates represented by placing a binary one in the Karnaugh map of FIG. 3C at the intersections of the first and second rows and the first column.

FIG. 3A illustrates a 16 bit RAM capable of producing one of sixteen output signals in response to any one of sixteen possible combinations of input signals. Thus input signals A and B control the X decoder to select any one of the four columns in the 16 bit RAM. Input signals C and D control the Y decoder to select any one of the four rows in the 16 bit RAM. The 16 bit RAM produces an output signal representative of the bit at the intersection of the selected row and column. There are 16 such intersections and thus sixteen such bits. There are $2^{16}$ possible combinations of functions capable of being represented by the set of 16 bits present in the 16 bit RAM. Thus, if a NOR gate is to be simulated by the 16 bits in the RAM, the Karnaugh map for the RAM would be as shown in FIG. 3C. In FIG. 3C all bits are "0" except the bit at the intersection of the first row (representing A=0, B=0) and the first column (representing C=0, D=0). Should a less frequently used function be desired to be generated by the 16 bit RAM, (for example, should a "1" output signal be desired for A=1, B=0, C=0 and D=0) then a binary "1" is stored at the intersection of the second row and the first column. Should a binary "1" be desired both when A=0, B=0, C=0 and D=0 and also when A=1, B=0, C=0 and D=0, then a binary "1" is stored at each of the intersections of the first column with the first row and the second row. The logic circuit represented by this loading of the RAM is as shown in FIG. 3D. Thus the RAM of FIG. 3A represents an elegant and simple implementation of any one of $2^{16}$ logic functions.

FIG. 3B shows another structure for yielding any one of sixteen select bits in a 16-bit RAM. Each of registers 0–15 in the vertical column to the left labelled "16 Select Bits", contains a selected signal, either a binary 1 or 0. By selecting the proper combination of A, B, C, and D, a particular bit stored in a particular one of the sixteen locations in the 16 Select Bits register is transmitted to the output lead. Thus, for example, to transmit the bit in the "1" register to the output lead, the signal A, B, C, D is applied to the leads so labeled. To transmit the signal labeled "15" in the sixteenth location in the 16 Select Bits register to the output lead, the signal A, $\overline{B}$, $\overline{C}$, and $\overline{D}$ is applied to the appropriate columns. Again, any one of $2^{16}$ logic functions can be implemented using this structure.

Figure 4A:
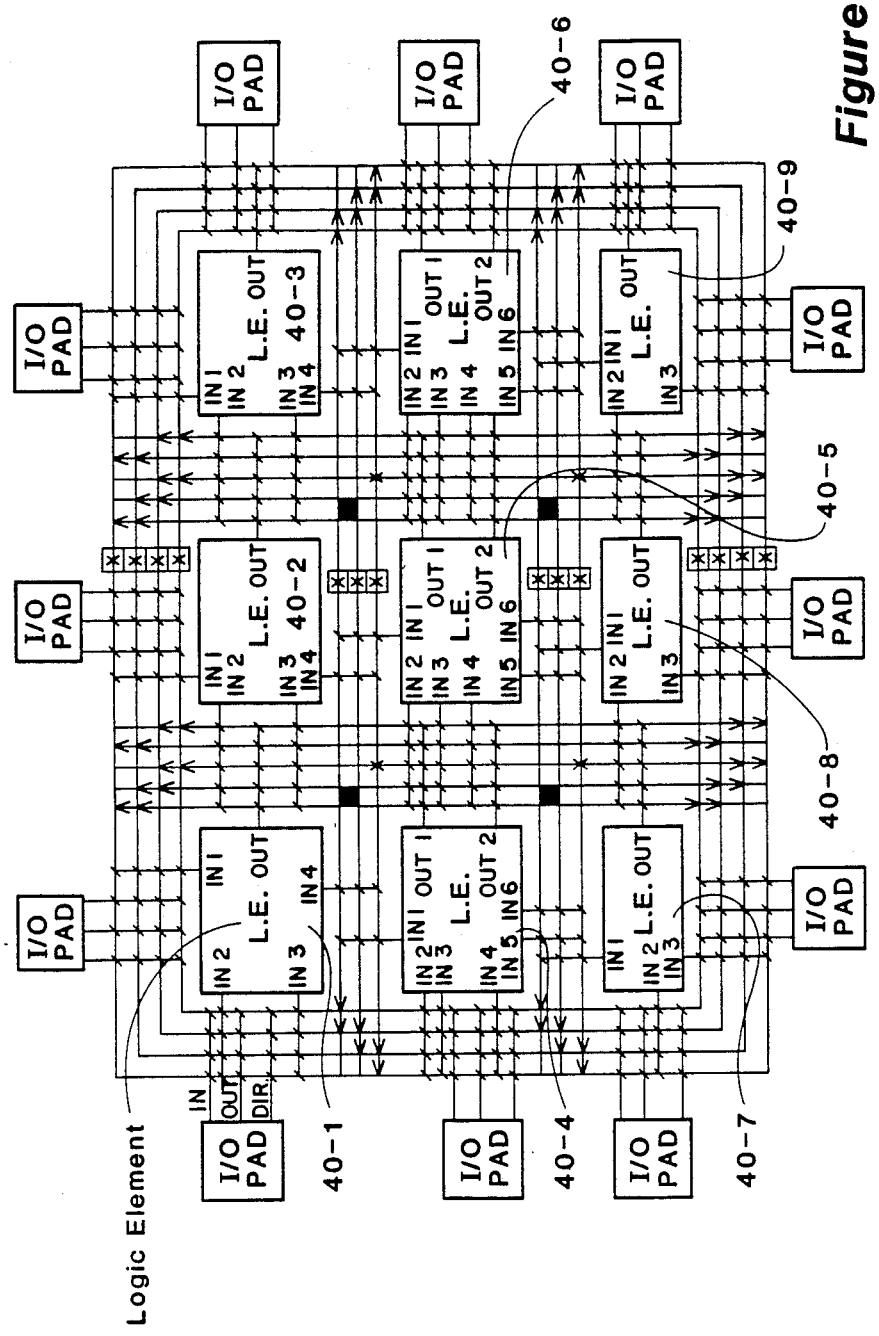
FIG. 4A illustrates one embodiment of my configurable electrical circuit wherein a plurality of configurable logic elements (shown as nine logic elements) are formed on an integrated circuit chip together with an array of leads including leads from the logic elements and from input/output pads, and programmable interconnects formed between selected leads to yield desired logic functions.

FIGS. 4A illustrates an embodiment of a configurable logic array of this invention containing nine configurable logical elements. As shown in FIG. 4A, nine logical elements are placed on an integrated circuit chip together with interconnects and variable switches for connecting various leads to other leads. Each of logic elements 40-1 through 40-9 represents a collection of circuitry such as that shown in FIG. 2 or some similar structure capable of being configured as described above with respect to FIG. 2 to perform any one of a number of logic functions. To program the circuitry, selected signals of a logic element such as shown in FIG. 2 are applied to input leads of the configurable logic element identified as configuration control input leads from a source such as the RAM of FIG. 3A or 3B described above thereby to generate a desired logical function in each of the logic elements. In FIG. 4A, no specific I/O pad has been identified as an input lead for applying the configuration control signals to the logic elements. However, any particular I/O pad can be selected for this purpose. The configuration control bits can be input into the configurable logic array of FIG. 4A either in series or in parallel depending upon design considerations. Input of configuration control bits is described later in conjunction with FIGS. 5, 8A, and 8B. In addition, another I/O pad will be used on input clock signals to clock the logic elements both for the shifting in of the configuration control signals to each configurable logic element and for controlling the operation of each logic element during the functioning of the integrated circuit chip in its intended manner. The combination of logic elements 40-1 through 40-9 as configured by the configuration control bits plus the interconnect structure of FIG. 4A yields the desired logical output for the Configurable Logic Array. FIG. 4B illustrates the meaning of the interconnect symbols used in FIG. 4A.

Figure 5:
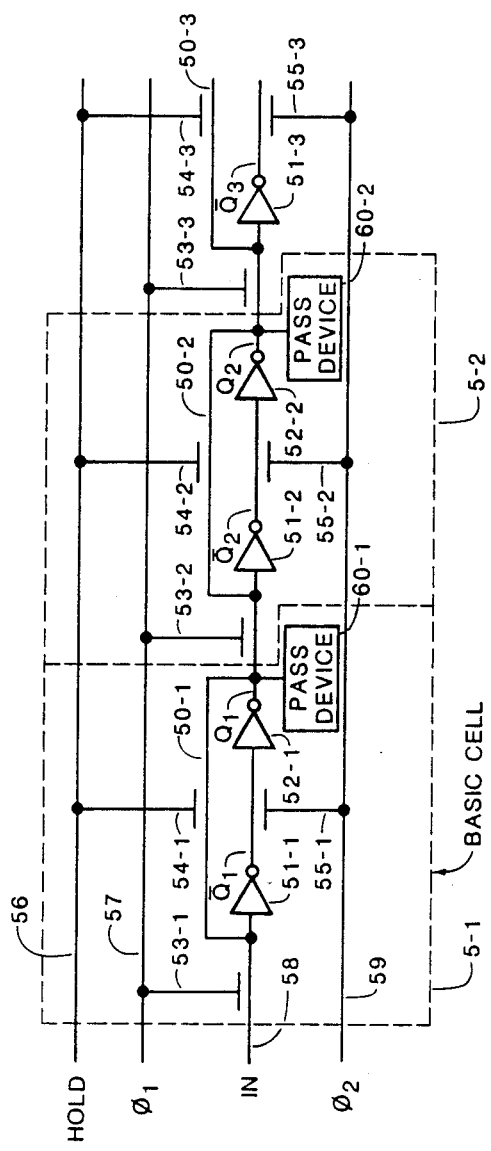
FIG. 5 represents a portion of the circuitry of a novel combination static and dynamic shift register appropriate for use with the configurable logic array of this invention.

To configure a logic element such as logic element 40-1 (FIG. 4A) a number of bits must be applied to the configuration control leads such as leads C0 through C5, as shown, for example, in FIG. 2. To do this, a shift register is utilized, in the preferred embodiment as part of each configurable logic element. FIG. 5 illustrates a novel shift register of use in this invention. The shift register of FIG. 5 is illustrated showing two basic storage cells. Each storage cell is capable of storing one bit of information. Of course, an actual shift register will contain as many storage cells as required to configure the logic element of which the shift register is a part, to its desired configuration. In operation, an input signal provided on one of the I/O pads shown in FIG. 4A is applied to input lead 58 of FIG. 5, which in FIG. 4A would be one of the logic element input lines. This input signal (shown in FIG. 6D) contains the pulses to be stored in the shift register as configuration control bits to configure the configurable logic element to perform a desired logic function or to configure an interconnection between leads in a manner to be described shortly. Thus the sequence of pulses applied to input lead 58 of FIG. 5 represents those pulses which when stored in the storage cells of the shift register will activate the configuration control bits in the proper manner to achieve the desired functional and/or interconnection result. For example, if the circuit of FIG. 2 is to be configured to form an AND gate, the pulses C0, C1, C2, C3, C4, and C5 would be represented by 1,1,X,X, 0,1.

The sequence of pulses applied to input lead 58 of FIG. 5 is synchronized with clocking pulses $\phi 1$ and $\phi 2$ applied to leads 57 and 59 respectively. Thus in the first period of operation clocking pulse $\phi 1$ goes high (FIG. 6A), clocking pulse $\phi 2$ is low (FIG. 6B), the hold signal (FIG. 6C) is low during shifting thereby facilitating the passage of data through sequentially connected cells 5-1, 5-2 et al. of the shift register of FIG. 5. To shift the pattern 01010 into the shift register, the following operations occur: The input signal (FIG. 6D) on lead 58 (FIG. 5) is low during approximately the first half cycle of the clocking period t1. The output signal $\overline{Q1}$ of inverter 51-1 goes to a high level in response to the low level input signal on lead 58 and $\phi 1$ high to enable PASS transistor 53-1. During the first clocking period t1, the clock signal $\phi 1$ goes low (FIG. 6A) and the clock signal $\phi 2$ shortly thereafter goes high (FIG. 6B) to enable PASS transistor 55-1. Consequently, the high level output signal $\overline{Q1}$ is transmitted to the input lead of inverter 52-1 by enabled pass transistor 55-1 and thereby produces a low level output signal Q1 on the output lead of inverter 52-1. Thus at the end of period t1, the output signal Q1 (FIG. 6F) from inverter 52-1 is low level. The output signals $\overline{Q2}$ and Q2 (FIGS. 6G, 6H) from inverters 51-2 and 52-2 in the second cell are still indeterminate because no known signal has yet propagated to the second storage cell 5-2 to change the signals of these inverters to a known state.

At the beginning of the second period (labeled "t2" in FIGS. 6A through 6H), $\phi 1$ goes high (FIGS. 6A through 6H) and $\phi 2$ is low (FIG. 6B) having gone low before period t1 ended. The input signal (FIG. 6D) now has risen to a high level representing a binary 1 and thus the output signal $\overline{Q1}$ of inverter 51-1 has gone low. The output signal Q1 of inverter 52-1 remains low because pass transistor 55-1 is held off by the low level $\phi 2$ signal. Some time through the second period $\phi 1$ goes low followed a fraction of time later by $\phi 2$ going high. At this time, the output signal $\overline{Q1}$ is transmitted through pass transistor 55-1 to inverter 52-1 thereby driving the output signal Q1 from inverter 52-1 to high level. Meanwhile, during period t2 the previous low level signal Q1 from inverter 52-1 has driven the output signal $\overline{Q2}$ of inverter 51-2 to a high level when d1 was at a high level to enable PASS transistor 53-2. Also the change in $\phi 2$ from a low level to a high level in the second half of period t2 to enable PASS transistor 55-2 drives the output signal Q2 from inverter 52-2 to a low level. In this manner, the input signal on lead 58 (FIG. 6D) is transmitted through each of the cells 5-1, 5-2, 5-3 et al. in the shift register. Upon the transfer into the shift register of the desired information, the hold signal (FIG. 6C) is enabled (i.e., driven to a high level) thereby to connect the feedback leads 50-1, 50-2, and 50-3 et al. from the output leads of inverters of one stage to input leads of inverters of the same stage so as to hold the information then in each cell indefinitely. In operation, the signal stored in a given cell of FIG. 5 is connected to a configuration control portion of a logic element or to an interconnect pass device.

The signals $\overline{Q}_1$, $Q_1$, $\overline{Q}_2$, $Q_2$, etc., from the shift register of FIG. 5 are directly connected to the (configuration) control inputs of a logic element such as shown in FIG. 4A or the pass devices of the configurable interconnect (to be explained later in conjunction with FIG. 9A).

When $\phi 1$ is low, $\phi 2$ and hold may be brought high, thus holding the data indefinitely. The entire shift register may be set or cleared by setting or clearing the input with $\phi 1$ and $\phi 2$ both high and HOLD low. Enough set/reset time must be allowed for the signal to propagate the entire length of the shift register to clear the shift register in this manner. Naturally this time is dependent upon the length of the shift register.

The shift register operates in its dynamic phase by storing the information being shifted as charge on the gates of the pass transistors (not shown in FIG. 5 but shown in FIG. 2 and well-known) comprising inverters 51-1, 52-1, 51-2, 52-2 et al. of the shift register. These inverters are of well-known design and will not be described in detail. The use of the dynamic shift register is an important feature of the invention because each cell of a dynamic shift register uses six transistors and thus takes up very little area. Uniquely, the dynamic shift register is converted to a static latch by adding only one transistor to each cell. Thus the novel dynamic shift register-static latch can be easily fabricated as part of a configurable logic element without adding significant complexity to the circuit or consuming significant semiconductor area. Because of the "hold" signal, the dynamic shift register can be driven at a very low frequency because placing the shift register on hold automatically refreshes the data. Thus a separate refresh circuit is not needed.

It will be apparent from the above description that the novel, dynamic shift register static latch circuit is unique in that it does not need refreshing once it has been latched into a hold position. This is accomplished by use of the feedback circuit comprising lead 50-1 and pass transistor 54-1 in cell 5-1, for example.

Figure 7A:
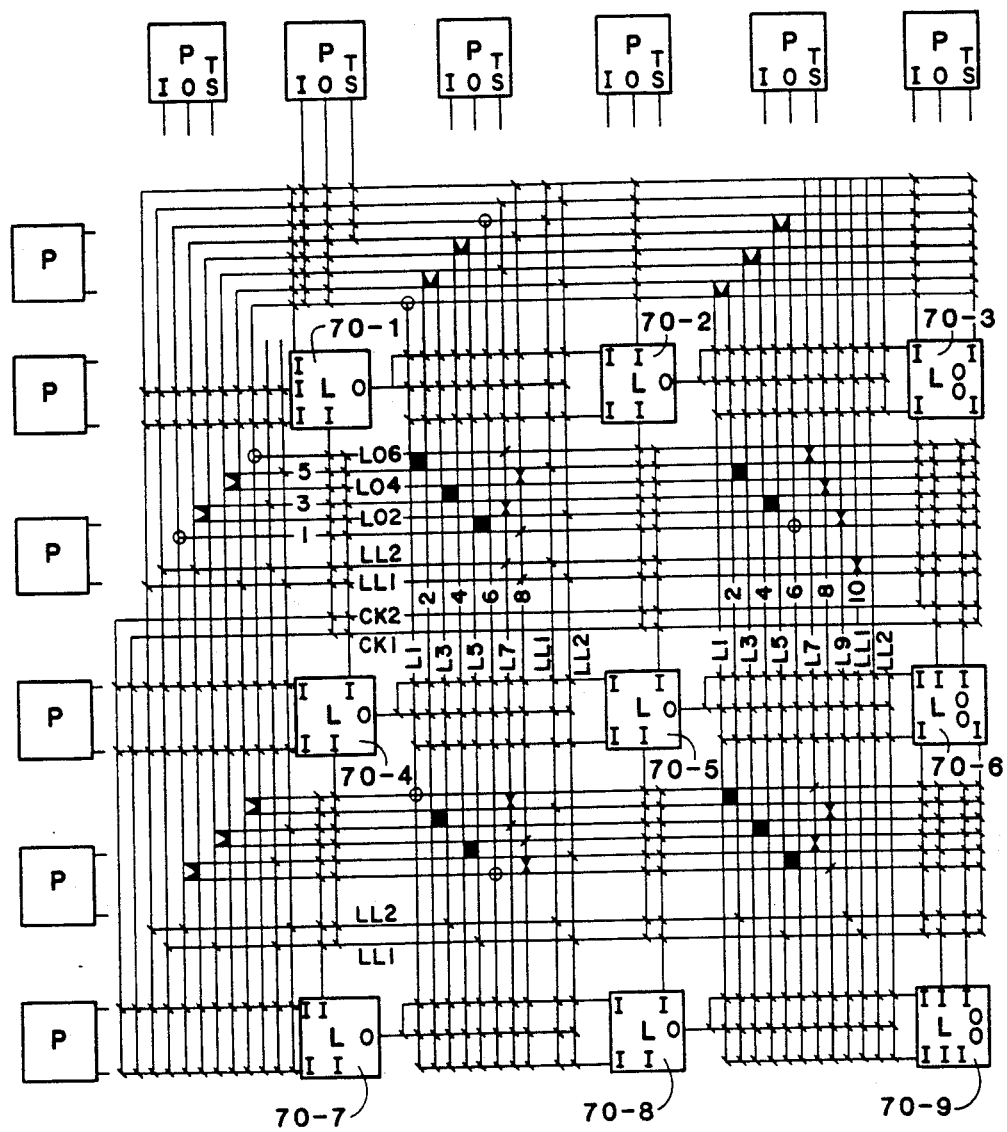
FIG. 7A represents a schematic diagram of a configurable logic array showing nine of N configurable logic elements where N is a selected integer greater than 9 and selected interconnections between conductive leads.

FIG. 7A shows an additional configurable logic array containing a plurality of configurable logic elements. In particular, configurable logic elements 70-1, 70-2, 70-4 and 70-5 are shown in their entirety while configurable logic elements 70-3, 70-6 and 70-7 through 70-9 are shown partially. The complete interconnections of these last five logical elements are not shown. The structure shown in FIG. 7A is merely illustrative of the types of configurations and connections which can be implemented using the configurable logic array of this invention and does not depict an actual circuit configured to carry out an intended function.

Figure 7B:
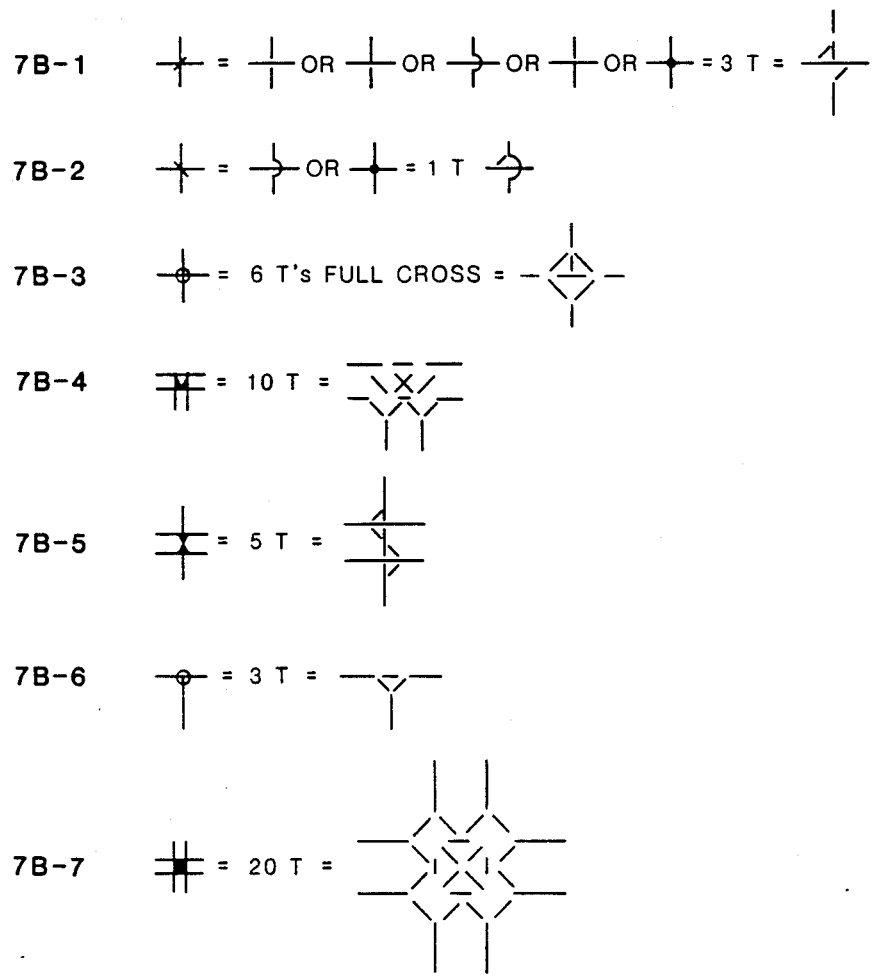

As shown in FIG. 7A, given leads can be interconnected by any one of a plurality of different means (i.e., interconnection structures). The symbols representing the interconnections shown in FIG. 7A are illustrated in FIG. 7B. In particular, while the schematics depicting various interconnections are to some extent self-explanatory, the conventions used in these schematics are explained in FIGS. 9A through 9G.

Figure 9A:
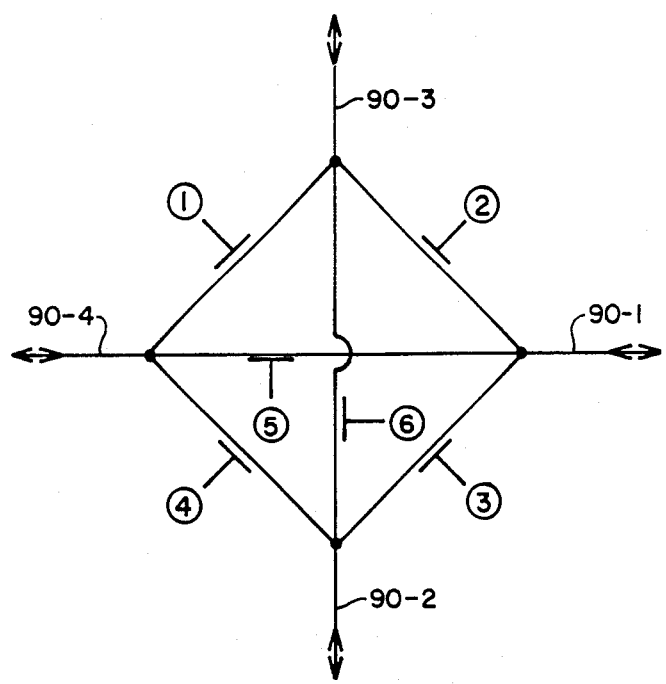
FIGS. 9A through 9G illustrate various topologies for forming interconnections such as those shown in FIGS. 7B-1 through 7B-7 between two or more leads in a configurable logic array.

FIG. 9A is the schematic of a circuit for making a number of different interconnections between two cross-over leads such as shown in FIG. 7B-3, horizontal lead 90-1 and vertical lead 90-2. Thus, in FIG. 9A, pass transistor 2, when activated into the conducting state, connects lead 90-3 to lead 90-1. Pass transistor 1, when conducting, connects lead 90-3 to lead 90-4. Pass transistor 4, when conducting, connects lead 90-4 to lead 90-2 and pass transistor 3, when conducting, connects lead 90-1 to lead 90-2. Pass transistors 6 and 5, when off, separate lead 90-2 from lead 90-3 and separate lead 90-1 from lead 90-4 respectively. Thus, should it be desired to connect vertical lead 90-2 to vertical lead 90-3, pass transistor 6 is activated. Likewise, should it be desired to connect horizontal lead 90-1 to horizontal lead 90-4, pass transistor 5 is activated. The terminology used to represent the possible connections between a plurality of leads can become quite complex. Thus, a simplified notation system as shown in FIGS. 9B to 9E has been adopted.

Figure 9B:
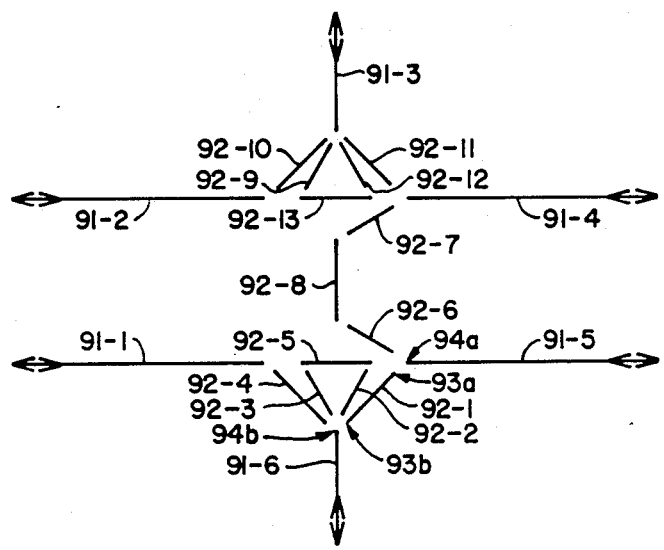

In FIG. 9B, a plurality of pass transistors 92-1 through 92-13 are shown. The convention adopted in FIG. 9B is to have a given pass transistor represented by a single short line. Thus, the line labelled 92-1 represents a pass transistor. Pass transistor 92-1 is drawn so that its two ends point to the ends of the leads 91-5 and 91-6 being interconnected by pass transistor 92-1. Thus, the right end 93a of pass transistor 92-1 is aimed to the end 94a of lead 91-5. The left end 93b of pass transistor 92-1 is aimed to the end 94b of lead 91-6. For simplicity and to avoid cluttering the drawing in FIG. 9B, the other ends of the transistors are not labelled. However, by visually aligning the line representing a given pass transistor with the ends of the leads 91-1 through 91-6 the particular two leads interconnected by that pass transistor can be determined. Thus, pass transistor 92-7 interconnects horizontal lead 91-4 with vertical lead 92-8. Pass transistor 92-13 interconnects horizontal lead 91-4 with horizontal lead 91-2. Pass transistor 92-12 interconnects lead 91-3 with lead 91-5. Similar connections can be made between the other pass transistors and the other leads.

The above description assumes that only two leads are to be interconnected. If more than two leads are to be interconnected, the structure of FIG. 9B can also be used for this purpose. Thus, lead 91-3 can be connected to lead 91-2 by turning on pass transistor 92-10. Simultaneously, lead 91-3 can be connected to lead 91-4 by turning on pass transistor 92-13. Alternatively, lead 91-3 could be connected to lead 91-4 by turning on pass transistor 92-11. Of course, this would also connect lead 91-4 through lead 91-3 and pass transistor 92-10 to lead 91-2. In addition, lead 91-6, for example, could be connected to the three leads 91-2, 91-3, 91-4 by turning on pass transistor 92-8. Clearly, a large number of permutations of interconnections can be made using this structure. In the case where all the pass transistors are turned on, all the leads 91-1 to 91-6 are interconnected. The resulting structure has a large capacitance which can actually be used in circuits as a component. Of course, all leads in FIG. 9B can be interconnected by turning on as few as five pass transistors. Note that in FIG. 9B leads 91-1 and 91-2 cannot be directly connected to each other nor can lead 91-4 be directly connected to lead 91-5 without involving another lead. However, this omission is not of importance because in an integrated circuit there is in general no need for two parallel leads to carry the same signal. Of course, two additional pass transistors could be added to the structure of FIG. 9B. FIG. 9B is considered to be merely a symbolic representation of intersecting leads and leads 91-1 and 91-2 are merely shown for convenience as being parallel but in fact can represent non-parallel leads on an integrated circuit.

Figure 9C:
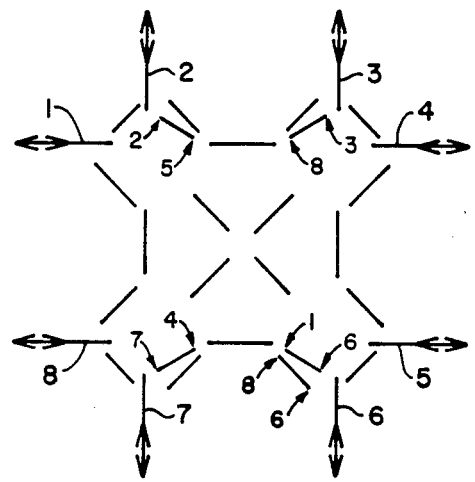
Figure 9D:
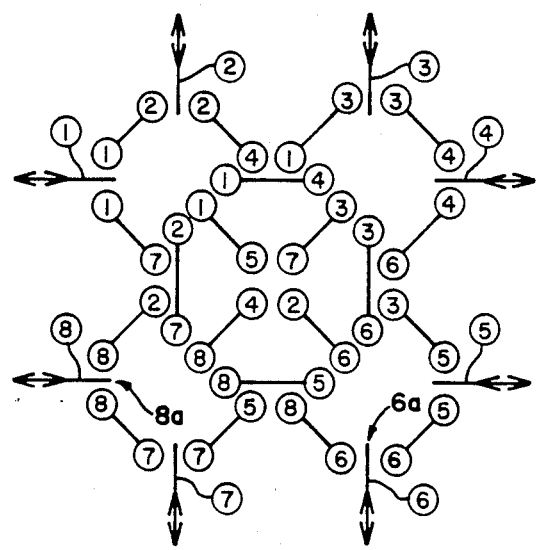

With reference to FIGS. 9C and 9D two other possible interconnection representations are illustrated. In FIG. 9D leads 1 to 8 are shown coming together at a complicated intersection. Leads 1 and 8 are parallel horizontal to the left, leads 4 and 5 are parallel horizontal to the right, leads 2 and 3 are parallel vertical up and leads 6 and 7 are parallel vertical down. Looking for a moment at lead 6, the end 6a of lead 6 can be connected sensibly to the ends "a" of leads 1, 2, 3, 4, 5 and 8. It is not sensible to connect lead 6 to lead 7 because theoretically the two leads are going in one direction and only one lead is required to carry the necessary information in that direction. Since lead 6 has six possible connections and there are eight leads, a total of forty-eight possible connections are offered by the structure of FIG. 9D. Since a given pass transistor connects two ends, twenty-four pass transistors are required to make the required forty-eight connections. The particular pass transistors have their ends labelled in FIG. 9D to illustrate the leads which are connected by a given pass transistor. Thus, pass transistor 6-8 interconnects the end 6a of lead 6 to the end 8a of lead 8. Pass transistor 7-5 interconnects the end of lead 7 to the end of lead 5. Because of the complexity of the structure of FIG. 9D a slightly different convention (a line with numbers on both ends) has been adopted for representing the pass transistor than that which was described above in conjunction with FIG. 9B.

Figure 9E:
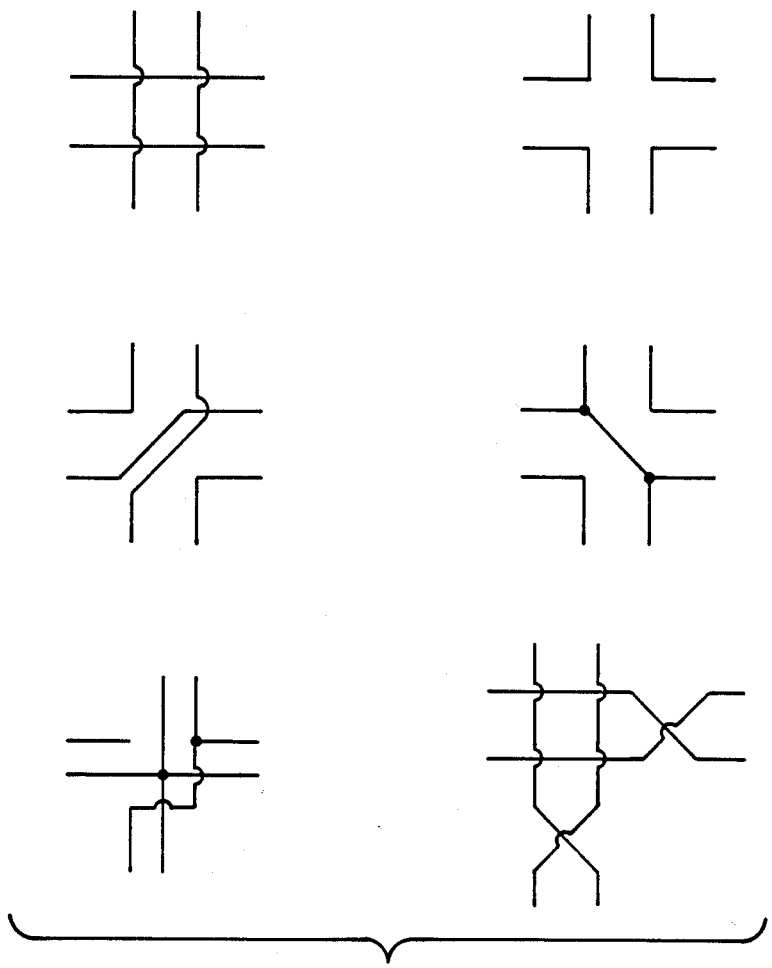

FIG. 9E illustrates types of interconnections possible using the method of this invention. The leads interconnected are illustrated by showing continuous lines or broken lines depending on whether a given lead is connected to another lead or left unconnected. These interconnections are self-explanatory.

Figure 9F:
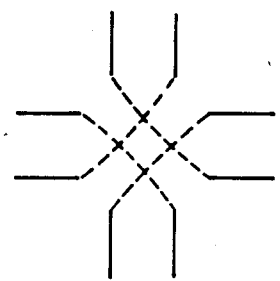
Figure 9G:
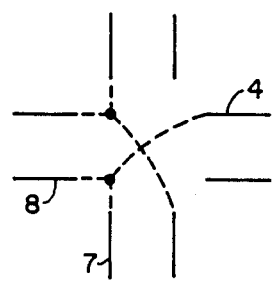

FIG. 9F illustrates the connections that would be possible if the four pass transistors 1-6, 2-5, 3-8, 4-7 omitted from FIG. 9D were in fact included. The dashed lines show the interconnecting possible by these omitted transistors. Thus, FIG. 9D shows only twenty pass transistors whereas twenty-four pass transistors are necessary to make all possible connections between the leads. FIG. 9G illustrates the way in which it is possible to interconnect leads 4 and 7 without the four transistor connections shown in FIG. 9F being present. Thus, to connect lead 4 to lead 7, lead 4 is connected directly to lead 8 by means of transistor 4-8 while lead 8 is connected to lead 7 by pass transistor 8-7.

FIG. 9C illustrates the configuration of FIG. 9D with the full twenty-four interconnection transistors shown rather than merely the twenty shown in FIG. 9D. As shown in FIG. 9C pass transistors 1-6, 7-4, 2-5 and 8-3 have been added to the transistors shown in FIG. 9D. For convenience and to avoid cluttering the drawing, the other pass transistors shown in FIG. 9D have not been numbered in FIG. 9C except for pass transistor 6-8.

Note that each of the interconnections shown above in FIGS. 9A through 9G requires only one gate in order to connect one lead to another except for the particular configuration illustrated in FIG. 9G wherein two gates are required. This means that the speed of circuits formed using the interconnections of this invention is greater than the speed of circuits using prior art interconnections.

The symbology used in FIGS. 7B-1 through 7B-7 is identical to the symbology just explained in conjunction with FIGS. 9A through 9G. Thus, for example, FIG. 7B-7 illustrates on the left the symbol for a 20 transistor interchange and on the right the locations of the 20 transistors, and corresponds precisely to the interchange explained above in conjunction with FIG. 9D.

FIG. 7B-1 illustrates three transistors capable of making a T connection, a cross-connection, or a four-way connection but not a vertical only connection and therefore not a full interconnection. By full interconnection is meant the ability to connect each of the leads (in FIG. 7B-1, four leads) coming into a node to a given node or to each of the other leads coming into the node in any combination.

FIG. 7B-2 shows a one transistor interconnection to connect a row with a column. FIG. 7B-3 shows a six transistor full cross interconnection wherein any one of four leads coming into a node can be connected to any one of the other three leads. FIG. 7B-4 shows six leads coming into an intersection wherein ten pass transistors are used to interconnect any one of the six input leads to any one of the five other leads input to the node. FIG. 7B-5 illustrates a four-lead node where two horizontal continuous leads are interconnected with two separate vertical leads using five pass transistors.

FIG. 7B-6 illustrates a three-transistor interconnection wherein any one of three leads coming into a node can be interconnected with any one of the other two leads. FIG. 7B-7 illustrates the twenty-transistor interchange for interconnecting any one of eight input leads to any one of the other eight input leads except that lead parallel and adjacent to the lead being interconnected as illustrated in FIG. 9D and except for the four interconnections shown in FIG. 9F.

FIGS 8A and 8B illustrate two possible systems capable of using the configurable logic arrays of this invention. In FIG. 8A, a microprocessor microcontroller produces address signals, control signals and data signals which are transmitted to a master configurable logic array. Also shown are N slave CLAs. As shown in FIG. 8A, the control bits to control each of the configurable logic elements in each slave configurable logic array are transmitted on the data leads from the microcontroller to the master configurable logic array. From the master configurable logic array, this data is transmitted in series to each one of N configurable logic arrays where N is a selected integer. The control bits for controlling the configuration of each configurable logic element in each of the configurable logic arrays are transmitted in series through slave configurable logic array 1, slave configurable logic array 2 through to the Nth configurable array. The data is stored in serial shift registers as described above in conjunction with FIG. 5. When the proper bits are located in the proper storage cells in each shift register, the hold signal shown in FIG. 6C is raised to a high level thereby locking each data bit into the proper location in the corresponding shift register thus configuring each configurable logic element in each configurable logic array. The data clock signals are applied on a separate lead to each configurable logic array, as shown, to clock in the control data.

The address arrow pointing to CLA (master) in FIG. 8A merely indicates that the microprocessor has the ability to select a particular master configurable logic array for receipt of data from the microprocessor. In FIG. 8B the master configurable logic array is capable of going into the nonvolatile memory with addresses to select particular data to be retrieved from the memory to be used to configure each of the slave configurable logic arrays. In FIG. 8A the microprocessor produces address signals which will go to off chip memory or to other circuitry (not shown).

In FIG. 8B the structure is similar to that shown in FIG. 8A except that a nonvolatile memory such as a ROM, EPROM or E$^2$PROM is used as the source for the configuration control bits to be transmitted into each of the configurable logic arrays. The structure of FIG. 8B is unique in that when power is turned on or when a reset signal is applied to the master CLA, the master CLA initiates the transfer of the information for controlling or configuring the Configurable Logic Array from the non-volatile memory to the master CLA and to the salve CLAs 1 to N. In this sense, the structure of FIG. 8B is self-configuring in response to power on or a reset signal.

Figure 11:
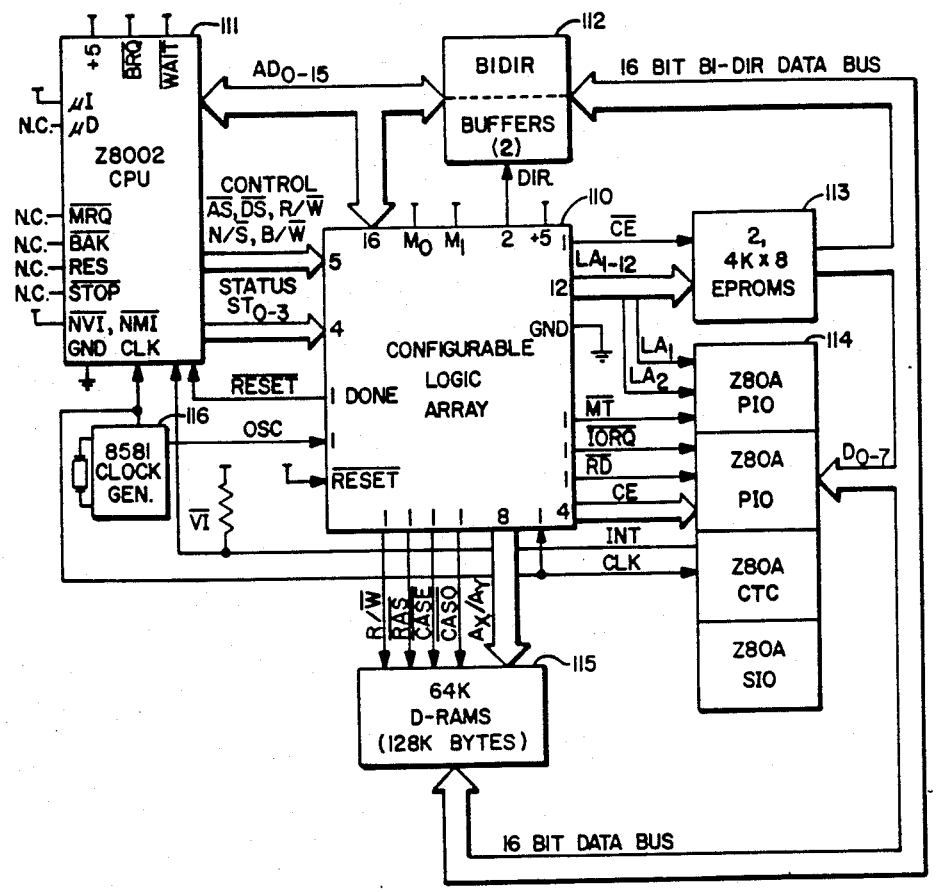
FIG. 11 shows a single board microcomputer using the Configurable Logic Array of this invention.

A single board microcomputer using a Configurable Logic Array of this invention is shown in FIG. 11. Configurable Logic Array 110 performs the chip decode functions, the latching functions and the various special logic that is necessary to implement a single board microcomputer. The CLA has an output lead ("DONE") which is low from the time the power is turned on until the single board microcomputer is fully functional.

The first event that occurs when power is turned on is that the Configurable Logic Array 110 forces the Z8002 CPU 111 ino the reset state. Reset forces the outputs of the CPU to be tri-stated (i.e., to go to high impedance level) which makes it possible for the Configurable Logic Array to use the control lines from the CPU 111 while it is being configured. The Configurable Logic Array 110 through a set of address lines (LA$_1$—LA$_{12}$) addresses the EPROMS 113 which are also used for the bootstrap of the Z8002 CPU 111. In addition, the EPROMS 113 have available in them configuration information for the CLA 110. The CLA 110 has signals which, during the self-loading time, are fixed so that particular bi-directional buffers 112 can be set in the correct direction for loading data from the EPROMS 113 to the Configurable Logic Array 110. Configurable Logic Array 110 then sequentially addresses locations in the EPROMS 113 which are read into the Configurable Logic Array 110 to configure the CLA 110. When array 110 is totally configured it then takes on its new functions and unlatches the DONE output which releases the reset line to the CPU 111. CPU 111 is then in control of the entire system. The decode used herein decodes the addresses from the CPU to create chip enables and chip selects for the various RAMS and EPROMS in the system and for the I/O devices as well.

Figure 10A:
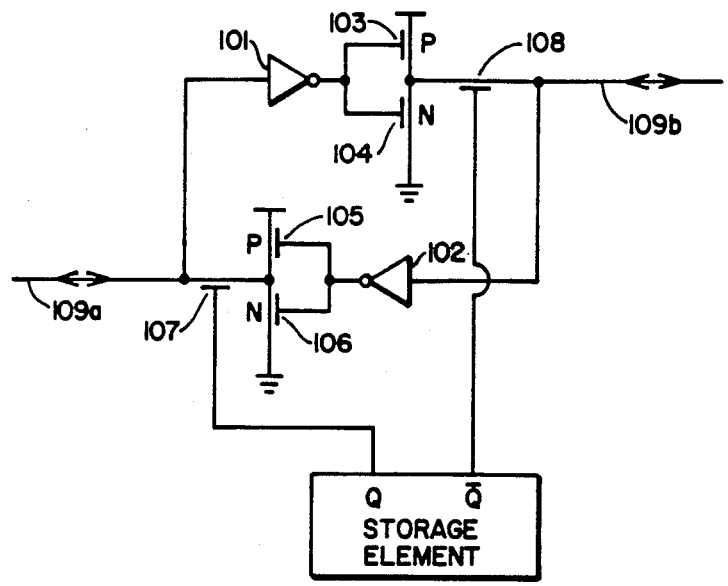
FIGS. 10A and 10B show a circuit for implementing the bidirectional buffer/amplifier represented by an "X" in a box in FIGS. 4A and 4B.
Figure 10B:
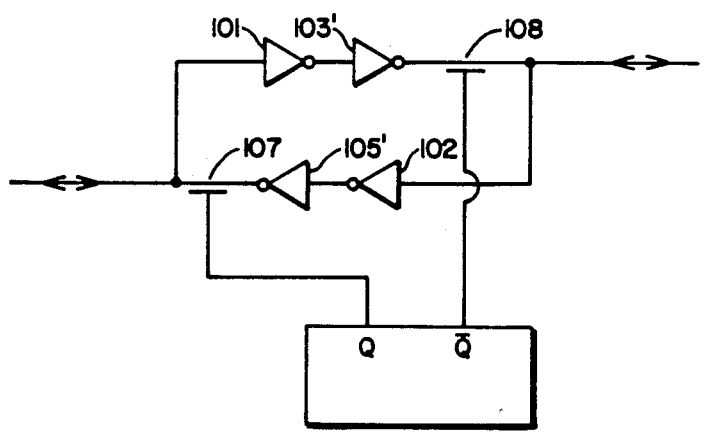

The bi-directional selectable buffer 112 shown in FIG. 11 is illustrated in more detail in FIGS. 10A and 10B. FIG. 10A shows the bi-directional buffer as comprising an inverter 101 connected into a CMOS inverter comprising p-channel transistor 103 and n-channel transistor 104, the output lead of which is gated by pass transistor 108. In the other direction, inverter 102 feeds an input signal onto the gates of p-channel pass transistor 105 connected in series with n-channel transistor 106. The output from the node between the p- and n-channel transistors is controlled by pass transistor 107. The pass transistors 107 and 108 are activated by the Q, $\overline{Q}$ signals from the storage element which can comprise a standard flip-flop. Thus, the buffer passes a signal in one direction or the other on leads 109a or 109b, depending upon whether or not pass transistor 107 or pass transistor 108 is turned on.

FIG. 10B illustrates schematically the circuit of FIG. 10A. In FIG. 10B, the series connected p-channel and n-channel transistors 103 and 104 have been represented by inverter 103' and series connected p-channel pass transistor 105 and n-channel pass transistor 106 have been represented by invertor 105'. Of course, in operation, the two circuits are identical.

With reference to FIGS. 4A and 4B directional amplifiers (shown by an X in a box) are used to amplify signals which have been attenuated by a number of pass transistors. This speeds up considerably the operation of the circuit. The delay of a signal increases approximately in proportion to the square of the number of pass transistors through which a signal must pass. The amplifier brings the signal voltage back to its normal level.

In view of the above description, it will be obvious to those skilled in the art that a configurable logic element in a Configurable Logic Array is capable of being reconfigured even after the Configurable Logic Array has been installed in a circuit. Indeed, this is one of the key advantages of the Configurable Logic Array of this invention. Thus, a Configurable Logic Array can be reconfigured to provide a new logical function as part of its normal operation in the system of which it is a part.

Another advantage of this invention is that the I/O pads can be used as either input or output pads and can be controlled by any internal signal using pass transistors.

While one embodiment of this invention has been described, other embodiments of this invention will be obvious in view of the above disclosure.

I claim:

1. An interconnect structure for programmably interconnecting lines within an integrated circuit comprising:
    at least three sets of interconnect line including a first set, a second set, and a third set;
    programmable means, not including said sets of interconnect lines, for connecting at least one of said lines in said first set to at least one of said lines in said second set, for connecting at least one of said lines in said first set to at least one of said lines in said third set, and for connecting at least one of said lines in said second set to at least one of said lines in said third set.

2. An array of interconnect structures, each said interconnect structure as in claim 1, and each interconnect structure in said array having its own selected number of interconnect lines and its own programmable means for connecting interconnect lines in its own first, second and third sets.

3. An interconnect structure as in claim 1 in which said first set comprises two lines; and
    said programmable means comprises
        means for connecting each of said two lines in said first set to at least one line in said second set and
        means for connecting each of said two lines in said first set to said at least one line in said third set.

4. An array of interconnect structures, each said interconnect structure as in claim 3, and each interconnect structure in said array having its own selected number of interconnect lines and its own programmable means for connecting interconnect lines in its own first, second and third sets.

5. An interconnect structure as in claim 3 in which said second set comprises two lines, and
    said third set comprises two lines; and
    said programmable means comprises
        means for connecting each of said two lines in said first set to each of said two lines in said second set,
        means for connecting each of said two lines in said first set to each of said two lines in said third set, and
        means for connecting each of said two lines in said second set to each of said two lines in said third set.

6. An array of interconnect structures, each said interconnect structure as in claim 5, and each interconnect structure in said array having its own selected number of interconnect lines and its own programmable means for connecting interconnect lines in its own first, second and third sets.

7. An interconnect structure as in claim 5 in which said at least three sets of interconnect lines includes a fourth set, and said interconnect structure further comprises:
    programmable means for connecting at least one of said lines in said fourth set to at least one of said lines in said first, second and third sets.

8. An array of interconnect structures, each said interconnect structure as in claim 7, and each interconnect structure in said array having its own selected number of interconnect lines and its own programmable means for connecting interconnect lines in its own first, second, third and fourth sets.

9. An interconnect structure as in claim 7 in which said programmable means for connecting at least one of said lines in said first, second, third, and fourth sets comprises programmable means for connecting said two lines in said first set to each of said two lines in said second set, for connecting said two lines in said first set to each of said two lines in said third set, for connecting said two lines in said first set to each of two lines in said fourth set, for connecting said two lines in said second set to each of said two lines in said third set, for connecting said two lines in said second set to each of said two lines in said fourth set, and for connecting said two lines in said third set to each of said two lines in said fourth set.

10. An array of interconnect structures, each said interconnect structure as in claim 9, and each interconnect structure in said array having its own selected number of interconnect lines and its own programmable means for connecting.

11. A configurable system comprising:
    one master configurable logic array;
    a plurality of slave configurable logic arrays;
    at least one memory;
    said master configurable logic array having
        means for retrieving data from said at least one memory,
        means for first using said data for configuring itself, and
        means for passing some of said data to said plurality of slave configurable logic arrays.

12. A configurable system as in claim 11 in which said means for retrieving data from said at least one memory includes
    means for addressing said memory cells in said at least one memory, and
    means for transferring selected data from said at least one memory to said master configurable logic array.

13. A configurable system as in claim 11 in which said plurality of slave configurable logic arrays include
    means for being configured and
    means for receiving and passing said data from said master configurable logic array to said plurality of slave configurable logic arrays whereby each of said slave configurable logic arrays is programmed according to said data in said at least one memory.

14. A configurable system as in claim 11 in which said means for passing some of said data to said plurality of slave configurable logic arrays comprises
    means for passing said data through said plurality of slave configurable logic arrays sequentially by means of a shift register controlled by clock signals provided by said master configurable logic array.

15. A configurable system comprising:
    a master configurable logic array;
    a plurality of slave configurable logic arrays; and
    a controller including
    means for addressing said configurable logic arrays and
    means for sending data to said configurable logic arrays; wherein said master configurable logic array includes
    means for being configured by said data from said controller and
    means for configuring said slave configurable logic arrays.

16. A configurable system as in claim 15 in which said slave configurable logic arrays include means for being configured and means for receiving and passing said data from said master configurable logic array.

17. A configurable system as in claim 15 in which said means for addressing further includes means for controlling sending said data from said means for sending data.

18. A configurable system as in claim 15 in which said means for configuring said slave configurable logic arrays comprises means for receiving data from said controller, means for passing some of said data to said slave configurable logic arrays and means for controlling the passing of said data to said slave configurable logic arrays.

19. A configurable system as in claim 15 in which said means for being configured of said master configurable logic array comprises means for receiving configuration control bits from said controller, and said means for configuring said slave configurable logic arrays comprises means for passing said data through said plurality of slave configurable logic arrays sequentially by means of a shift register as controlled by clock signals provided by said master configurable logic array.

20. A configurable system as in claim 11 wherein said memory is nonvolatile.

21. A programmable circuit comprising: a plurality of configurable logic elements, each configurable logic element having a plurality of input leads and at least one output lead and having a programming means to cause said configurable logic element to perform a selected logic function;
a plurality of input/output ports;
a group of interconnect lines;
means for programmably connecting each of said input leads of each of said configurable logic elements to at least one of said interconnect lines;
means for programmably connecting said at least one output lead of each of said configurable logic elements to at least one of said interconnect lines;
means for programmably connecting each of said input/output ports to at least one of said interconnect lines; and
means for programmably connecting each one of said interconnect lines to at least one other of said interconnect lines;
whereby each of said input leads and each of said at least one output lead of each of said configurable logic elements can be connected directly or indirectly to each of said input/output ports and to each other, and whereby each of said configurable logic elements can be programmed to perform a selected one of a plurality of logic functions, and said configurable logic elements can be connected to each other and to said input/output ports in a selectable manner.

22. A programmable circuit as in claim 21 wherein said programming means of each of said configurable logic elements comprises logic element pass transistors.

23. A programmable circuit as in claim 22 wherein said programming means includes a plurality of memory cells and wherein each of said logic element pass transistors is controlled by a corresponding one of said plurality of memory cells.

24. A programmable circuit as in claim 23 in which said plurality of memory cells forms at least part of a shift register, control signals being loaded into said memory cells by being transferred through said shift register until each of said signals is properly located in said corresponding one of said memory cells.

25. A programmable circuit as in claim 23 in which said memory cells can be re-programmed.

26. A programmable circuit as in claim 21 in which each of said interconnect lines is capable of being connected directly or indirectly to one or more of the other of said interconnect lines, to one or more of said input/output ports, to one or more of said input leads and to one or more of said output leads, thereby allowing a user to connect said leads and lines together as desired.

27. A programmable interconnect circuit as in claim 21 wherein said means for programmably connecting each of said input leads of each of said configurable logic elements to at least one of said interconnect lines, said means for programmably connecting said at least one output lead of each of said configurable logic elements to at least one of said interconnect lines, said means for programmably connecting each of said input/output ports to at least one of said interconnect lines, and said means for programmably connecting each of said interconnect lines to at least one other of said interconnect lines comprise pass transistors.

28. A programmable circuit as in claim 27
wherein said means for programmably connecting further comprises memory cells, said memory cells forming at least part of a shift register,
wherein each of said pass transistors is controlled by one of said memory cells, and
wherein said means for programmably connecting further comprises means for transferring said series of signals through said shift register until each of said signals is properly located in an associated one of said memory cells uniquely coupled to one of said pass transistors.

29. A programmable circuit as in claim 28 in which said means for programmably connecting includes means for changing the contents of said memory cells, thereby to reconfigure said programmable circuit.

* * * * *

UNITED STATES PATENT AND TRADEMARK OFFICE
CERTIFICATE OF CORRECTION

PATENT NO. : 4,870,302

DATED : September 26, 1989

INVENTOR(S) : Ross H. Freeman

It is certified that error appears in the above-identified patent and that said Letters Patent is hereby corrected as shown below:

Col. 1, line 12, insert --and-- before "means".

Col. 2, line 35, "of "CLA"" should read --or "CLA"--.

Col. 5, line 50, "Figs." should read --Fig.--.

Col. 5, line 61, delete "selected signals".

Col. 5, line 62, insert --selected signals-- after "Fig. 2".

Col. 10, line 6, "interconnecting" should read --interconnections--.

Col. 11, line 64, "ino" should read --into--.

Col. 13, line 5, "line" should read --lines--.

Signed and Sealed this

Twenty-fifth Day of June, 1991

*Attest:*

HARRY F. MANBECK, JR.

*Attesting Officer*

*Commissioner of Patents and Trademarks*